(12) United States Patent
Schuderer et al.

(10) Patent No.: US 11,107,740 B2
(45) Date of Patent: Aug. 31, 2021

(54) POWER SEMICONDUCTOR MODULE

(71) Applicants: ABB Power Grids Switzerland AG, Baden (CH); Audi AG, Ingolstadt (DE)

(72) Inventors: Jürgen Schuderer, Zürich (CH); Umamaheswara Vemulapati, Wettingen (CH); Marco Bellini, Schlieren (CH); Jan Vobecky, Lenzburg (CH)

(73) Assignee: ABB Power Grids Switzerland AG, Baden (CH)

( * ) Notice: Subject to any disclaimer, the term of this patent is extended or adjusted under 35 U.S.C. 154(b) by 0 days.

(21) Appl. No.: 15/666,858

(22) Filed: Aug. 2, 2017

(65) Prior Publication Data

US 2018/0040526 A1  Feb. 8, 2018

(30) Foreign Application Priority Data

Aug. 2, 2016 (EP) ..................... 16182374

(51) Int. Cl.
*H01L 23/34* (2006.01)
*H01L 23/14* (2006.01)
(Continued)

(52) U.S. Cl.
CPC ............ *H01L 23/147* (2013.01); *H01L 23/36* (2013.01); *H01L 23/3736* (2013.01);
(Continued)

(58) Field of Classification Search
CPC ....... H01L 29/122–127; H01L 29/7802; H01L 29/66712; H01L 29/41741; H01L 29/456;
(Continued)

(56) References Cited

U.S. PATENT DOCUMENTS 4,994,871 A * 2/1991 Chang ................. H01L 29/0692
257/139
5,548,133 A * 8/1996 Kinzer ..................... H01L 23/34
257/140

(Continued)

FOREIGN PATENT DOCUMENTS

EP  411595 A2  2/1991
EP  411595 A3  11/1991
(Continued)

OTHER PUBLICATIONS

Toshiba, IGBTs (Insulated Gate Bipolar Transistor), Sep. 1, 2018, (https://toshiba.semicon-storage.com/info/docget.jsp?did=63557), pp. 1-40 (Year: 2018).*

(Continued)

*Primary Examiner* — Mary A Wilczewski
*Assistant Examiner* — Tsz K Chiu
(74) *Attorney, Agent, or Firm* — Slater Matsil, LLP

(57) ABSTRACT

A power semiconductor module including at least one power semiconductor chip providing a power electronics switch; and a semiconductor wafer, to which the at least one power semiconductor chip is bonded; wherein the semiconductor wafer is doped, such that it includes a field blocking region and an electrically conducting region on the field blocking region, to which electrically conducting region the at least one power semiconductor chip is bonded.

23 Claims, 8 Drawing Sheets

(51) Int. Cl.
  *H01L 23/62* (2006.01)
  *H01L 25/07* (2006.01)
  *H01L 23/373* (2006.01)
  *H01L 23/36* (2006.01)
  *H01L 23/535* (2006.01)
  *H01L 23/538* (2006.01)
  *H01L 25/18* (2006.01)
  *H01L 29/06* (2006.01)

(52) U.S. Cl.
  CPC ........ *H01L 23/535* (2013.01); *H01L 23/5386* (2013.01); *H01L 23/62* (2013.01); *H01L 25/072* (2013.01); *H01L 25/18* (2013.01); *H01L 29/0634* (2013.01); *H01L 29/0646* (2013.01); *H01L 2224/16227* (2013.01); *H01L 2224/48091* (2013.01); *H01L 2224/48227* (2013.01); *H01L 2224/73221* (2013.01); *H01L 2224/73265* (2013.01); *H01L 2224/8384* (2013.01); *H01L 2224/83801* (2013.01); *H01L 2924/00014* (2013.01); *H01L 2924/1033* (2013.01); *H01L 2924/10252* (2013.01); *H01L 2924/10272* (2013.01); *H01L 2924/1203* (2013.01); *H01L 2924/1301* (2013.01); *H01L 2924/1304* (2013.01)

(58) Field of Classification Search
  CPC . H01L 2924/19043; H01L 2924/13055; H01L 2924/13091; H01L 2924/0002; H01L 2924/00; H01L 29/66681–66704; H01L 29/7816–7826; H01L 2224/83801; H01L 2224/48091; H01L 2224/73221; H01L 2224/48227; H01L 2224/8384; H01L 2224/73265; H01L 2224/16227; H01L 2924/1203; H01L 2924/10252; H01L 2924/1304; H01L 2924/1033; H01L 2924/00014; H01L 2924/10272; H01L 2924/1301; H01L 29/0634; H01L 29/0646; Y10T 428/24917
  See application file for complete search history.

(56) References Cited

U.S. PATENT DOCUMENTS

| | | | | |
|---|---|---|---|---|
| 5,731,603 | A * | 3/1998 | Nakagawa | H01L 29/0696 257/140 |
| 6,310,401 | B1 | 10/2001 | Stoisieck et al. | |
| 6,773,995 | B2 * | 8/2004 | Shin | H01L 21/823487 257/332 |
| 6,838,321 | B2 * | 1/2005 | Kaneda | H01L 29/0834 257/119 |
| 7,180,158 | B2 * | 2/2007 | Khemka | H01L 29/063 257/155 |
| 7,244,989 | B2 * | 7/2007 | Khemka | H01L 29/0634 257/341 |
| 7,329,566 | B2 * | 2/2008 | Khemka | H01L 29/66325 257/E21.382 |
| 7,508,032 | B2 * | 3/2009 | Chiang | H01L 29/0634 257/345 |
| 7,723,802 | B2 * | 5/2010 | Terashima | H01L 27/0647 257/378 |
| 7,960,786 | B2 * | 6/2011 | Huang | H01L 29/7835 257/341 |
| 9,100,000 | B2 * | 8/2015 | Saito | H03K 17/00 |
| 10,679,928 | B2 * | 6/2020 | Kasuya | H01L 23/49562 |
| 10,978,446 | B2 * | 4/2021 | Iwamizu | H01L 23/49524 |
| 2001/0014413 | A1 | 8/2001 | Lefranc | |
| 2003/0232477 | A1 * | 12/2003 | Deboy | H01L 29/7802 438/305 |
| 2004/0043565 | A1 * | 3/2004 | Yamaguchi | H01L 29/0653 438/268 |
| 2004/0140116 | A1 | 7/2004 | Bayerer et al. | |
| 2006/0171130 | A1 | 8/2006 | Konishi et al. | |
| 2006/0177967 | A1 * | 8/2006 | Muto | H01L 24/84 438/109 |
| 2007/0148422 | A1 * | 6/2007 | Schulze | H01L 29/41741 428/209 |
| 2007/0200183 | A1 * | 8/2007 | Rueb | H01L 29/66727 257/401 |
| 2009/0321924 | A1 * | 12/2009 | Funakoshi | H01L 23/4735 257/722 |
| 2010/0308303 | A1 * | 12/2010 | Chang | B82Y 10/00 257/15 |
| 2014/0138707 | A1 | 5/2014 | Miki et al. | |

FOREIGN PATENT DOCUMENTS

| | | | | |
|---|---|---|---|---|
| EP | 3 279 935 | A1 * | 2/2018 | ............ H01L 23/14 |
| JP | 2000157409 | A1 | 2/2001 | |
| JP | 2013191716 | A | 9/2013 | |
| WO | 0104914 | A1 | 1/2001 | |
| WO | 2011080093 | A1 | 7/2011 | |

OTHER PUBLICATIONS

European Search Report, EP16182374.5, ABB Schweiz AG, dated Mar. 15, 2017, 3 pages.

Hohlfeld et al., "Stacked substrates for high voltage applications," CIP 2012, Mar. 6-8, 2012, Nuremberg, Germany, 4 pp.

"Reliable and extremely long-lasting-high-voltage power electronics for network expansion," innovations report, Forum for Science, Industry and Business, retrieved from http://www.mikroelektronik.fraunhofer.de/en/press-and-media/microelectronics-news/news/detail/News/reliable-and-extremely-long-lasting-high-voltage-power-electronics-for-network-expansion-1871.html.

Indian Examination Report dated Aug. 27, 2019 issued in Application No. 201744027054 (5 pages).

* cited by examiner

POWER SEMICONDUCTOR MODULE

FIELD OF THE INVENTION

The invention relates to the field of packaging of power semiconductors. In particular, the invention relates to a power semiconductor module.

BACKGROUND OF THE INVENTION

Wide bandgap power devices, which, for example, may be based on SiC, may be realized with blocking voltages exceeding 20 kV to 30 kV. Such devices may provide a plurality of advantages compared to conventional Si substrate power devices. For example, the entire voltage range of medium voltage applications may be covered with simple two-level voltage source converter topologies. Furthermore, for typical two-level or three-level topologies in high voltage applications, the number of semiconductors in series connection may be reduced. For modular multi-level converters or cascaded half-bridge topologies in high voltage applications, the number of converter cells may be reduced. In general, this also may reduce the number of gate drivers and the number of stacked coolers and power modules.

Additionally, the size of the wide bandgap devices and related modules may be reduced compared to the Si devices.

Usually, for packaging power semiconductor chips, these chips are bonded to a substrate such as direct bonded Cu (DBC), active metal brazed Cu (AMB) or direct bonded Aluminum (DBA). It is common to these technologies that there is usually no field grading at sharp metallization edges and AMB braze protrusions, where the metallization stops and where a critical triple point between metal, ceramic and gel encapsulation is formed.

Field grading may relate to mitigating a maximal field strength inside a power semiconductor module for avoiding partial discharges. There are many field grading approaches relating to ceramic substrates.

U.S. Pat. No. 6,310,401 B1 relates to a linear resistive field grading realized by a resistive layer disposed on the ceramic.

In US 2004/0140116 A1, a resistive filler within a gel surround power electronics components is used for resistive field grading.

It is also known to use a polyimide coating dispensed on metallization edges and channels of ceramic substrates to increase the dielectric strength at the metallization edges. This may avoid partial discharges and may improve the mechanical strength of the Cu/ceramic interface.

In WO2011/080093 A1, a nonlinear resistive field grading based on a micro-varistor filler material is proposed.

In US 2001/0014413A1 and WO 01/04914A1, linear refractive field grading approaches are described, which are based on a high permittivity material.

Due to the partial discharge requirements for power semiconductor modules it is a challenge to scale metallized substrates for power devices above 6.5 kV which is the maximum blocking voltage of industrial applications today.

DESCRIPTION OF THE INVENTION

When scaling power modules to very high voltages, methods of increasing the thicknesses of a ceramics substrate, on which the semiconductor chips are bonded, may not be promising due to their negative impact on the cooling of the power semiconductor devices and due to limited expected benefit since the peak electric field at a sharp electrode tip (of radius r) scales with the voltage ~V/r rather than the distance to ground.

Furthermore, field grading approaches outside the ceramics substrate or in an encapsulation, in which the semiconductor chips are immersed, such as resistive layers, high-permittivity fillers and non-linear resistive layers, may not be successful due to limited flexibility in field grading design and due to manufacturing issues of field grading layers and materials.

It is an objective of the invention to provide a robust, industrial applicable power semiconductor module with high resistance against partial discharges that may be used for packaging wide bandgap semiconductor devices.

This objective is achieved by the subject-matter of the independent claim. Further exemplary embodiments are evident from the dependent claims and the following description.

The invention relates to a power semiconductor module. A power semiconductor module may be a device comprising one or more power semiconductor chips and further components for electrically connecting and mechanically supporting the one or more power semiconductor chips. Furthermore, a power semiconductor module may comprise a housing and/or encapsulation, in which the one or more power semiconductor chips are accommodated.

The term "power" here and in the following may refer to a module and/or semiconductor chips adapted for processing currents of more than 10 A and/or more than 1 kV.

According to an embodiment of the invention, the power semiconductor module comprises: at least one power semiconductor chip providing a power electronics switch and a semiconductor wafer, to which the at least one power semiconductor chip is bonded, wherein the semiconductor wafer is doped, such that it comprises a field blocking region and an electrically conducting region on the field blocking region, to which electrically conducting region the at least one power semiconductor chip is bonded. Bonding may refer to soldering, sintering, gluing or other types of attachment.

In other words, the semiconductor wafer may be used as a substrate for electrically insulating and mechanically supporting the at least one power semiconductor chip and/or for providing field grading at edges of electrically conductive areas of high voltage electrical potential on which the power semiconductor chips are attached to. An electrical field generated by the power semiconductor module layout with electrically conductive areas on different potential is attenuated/mitigated inside the semiconductor wafer. It may be possible that the highest field strength is generated inside the semiconductor wafer at a junction between differently doped regions, where partial discharges may be suppressed very strongly.

The semiconductor wafer may be a Si or SiC wafer. Such a wafer may be very well suited as a substrate, since it may have an excellent CTE match to all power semiconductor materials (for example to allow for high reliability bond interfaces). In particular, the semiconductor wafer may be made of the same material as the semiconductor chip.

Furthermore, a semiconductor wafer may have an excellent thermal conductivity for heat spreading and cooling of power devices (such as of 150 W/mK for a Si wafer).

The power semiconductor chip may be a conventional Si based chip. The power semiconductor chip also may provide a wide bandgap device and/or may be based on SiC or GaN. The power electronics switch of the semiconductor chip may be a transistor, thyristor or diode.

Summarized, according to an embodiment of the invention, the semiconductor wafer is made from Si or from SiC, and the semiconductor chip provides a wide bandgap electronics component. In particular, the power semiconductor module may be adapted for processing voltages of more than 10 kV that may be switched by wide bandgap electronics components, such as transistors and diodes.

For example, the semiconductor wafer may be made of a base substrate, which is doped to generate the electrically conducting region. The electrically conducting region may be formed in an upper part of the semiconductor wafer. In particular, the electrically conducting region may be provided on a top surface of the semiconductor wafer.

The electrically conducting region may be seen as a vertical voltage blocking structure, which moves high field gradients and/or high field strength inside the semiconductor wafer.

The base substrate may be a semiconductor substrate which is n-doped below $5 \cdot 10^{12}/cm^3$ or is p-doped below $1.7 \cdot 10^{13}/cm^3$. The field blocking region also may be doped in such a way. The electrically conducting region may be n-doped much higher, for example may comprise 100 times more charge carriers. The field blocking region may be a layer of the semiconductor wafer that may be a substantially insulating layer.

The semiconductor chip may be arranged above the electrically conducting region and/or may be bonded to the electrically conducting region. It has to be noted that the semiconductor chip directly may be bonded to a metallization layer provided on the electrically conducting region or may be bonded to other electrically conducting elements, which may be bonded to such a metallization layer.

According to an embodiment of the invention, the semiconductor wafer is doped, such that the electrically conducting region is surrounded by a field mitigation structure adapted for lowering a maximal electrical field strength in the semiconductor wafer. For example, the field mitigation structure, which also may be provided in an upper part and/or at the top surface of the semiconductor wafer, which may be doped in the same way (i.e. n-doped or p-doped) as the electrically conducting region. Doping of the electrically conducting region and the field mitigation structure may be based on implantation doping, diffusion doping, deposition doping and optionally followed by drive-in or activation.

The field mitigation structure also may be seen as an edge termination structure for the edge of the electrically conducting region.

According to an embodiment of the invention, the field mitigation structure comprises an electrically conducting field mitigation region with a doping that varies dependent on a distance to the electrically conducting region. For example, the n doping of the field mitigation region may become smaller with raising horizontal distance from the electrically conducting region. Such a field mitigation region may be generated with a VLD (variation of lateral doping) process.

According to an embodiment of the invention, the field mitigation region is in electrical contact with the electrically conducting region, in particular inside the semiconductor wafer. In such a way, resistive field mitigation may take place in the field mitigation region.

According to an embodiment of the invention, the field mitigation structure comprises a number of electrically conducting rings (which may be called field rings) electrically isolated from the electrically conducting region, at least inside the semiconductor wafer. It may be possible that the rings are surrounding the electrically conducting region solely partially. However, it also may be possible that the rings are closed.

It may be that the rings are higher doped than the electrically conducting region. For example, the electrically conducting region may be n-doped, wherein the rings are formed from n-doped or n$^+$-doped regions.

Here, in the above and in the following, the signs "+" and "−" may refer to doping about 10 to 100 times higher and/or lower with respect to doping without "+" or "−". For example, an n$^+$-doped region may be doped 10 to 100 times higher than an n-doped region, which may be doped 10 to 100 times higher than an n$^−$-doped region.

It also may be that a ring width of the rings is constant or varies with respect to a distance of the ring to the electrically conducting region. For example, the ring width may decrease with raising distance from the electrically conducting region.

It also may be that a ring depth of the rings is shallower or deeper than the electrically conducting region.

The field rings may be floating or at least partially biased.

According to an embodiment of the invention, the field rings are electrically floating. I.e. they are not connected to a conductor of the power semiconductor module, which, during operation of the power semiconductor module, provides a specific potential (such as ground or DC+ or DC−).

According to an embodiment of the invention, the field rings are at least partially electrically connected to an electric potential provided by the power semiconductor module. For example, the field rings may be connected partially via a semi-insulating layer to the electrical potential.

According to an embodiment of the invention, the electrically conducting region is n-doped, wherein the field mitigation region surrounding the electrically conducting region is lesser n-doped than the electrically conducting region and/or wherein the field rings surrounding the electrically conducting region are lesser n-doped than the electrically conducting region.

According to an embodiment of the invention, a passivation layer is provided on a surface of the semiconductor wafer above the electrically conducting region. This passivation layer may at least be provided besides the semiconductor chip and/or may be provided above the field mitigation structure. For example, the passivation layer, which may protect the surface of the semiconductor wafer from chemical degrading, may be made of a polyimide.

According to an embodiment of the invention, the semiconductor wafer is doped such that between two electrically conducting regions, to which semiconductor chips are bonded, an electrically conducting runner is provided, which is connected to an electric potential provided by the power semiconductor module. The runner may be an electrically conducting region between two field mitigation structures, which is electrically isolated from the field mitigation structures. The runner may be connected to DC− or to ground potential. The runner also may be generated by doping the semiconductor wafer. For example, the runner may be p-doped or p$^+$-doped. With such a runner, a leakage current from the electrically conducting regions below the semiconductor chip may be reduced.

According to an embodiment of the invention, the semiconductor wafer comprises a back layer higher p-doped than the central field blocking region. For example, the doping at the back side of the semiconductor wafer may be p$^+$, p or p$^−$.

To this back layer, a metallization layer, which may cover the complete back side of the semiconductor wafer, may be attached.

According to an embodiment of the invention, the field blocking region of the semiconductor wafer has a thickness of more than 1 mm (for example between 1 mm and 2.5 mm) and/or the electrically conducting region has a thickness between 10 to 50 μm. In other words, the electrically conducting region may be much thinner than the field blocking region.

According to an embodiment of the invention, the power semiconductor module further comprises: a metallization layer on the electrically conducting region, to which the semiconductor chip is electrically connected. Such a metallization layer may be added for bonding the semiconductor chip and/or electrically conducting sheets.

According to an embodiment of the invention, an electrically conducting sheet is bonded to the metallization layer. The electrically conducting sheet may be much thicker, for example more than 10 times thicker, than the metallization layer on the electrically conducting region. The electrically conducting sheet may be made of Cu, Al, Ag, Mo or Graphene.

Furthermore, a metallization layer on the back side of the semiconductor wafer, i.e. on a side opposite to the side, where the electrically conducting region is provided, may be provided. To this metallization layer, a further metal sheet or metal body, such as a body of Molybdenum, may be bonded, which may act as mechanical support and/or as heat sink.

According to an embodiment of the invention, the power semiconductor module comprises a metal body to which the semiconductor wafer is bonded with a back side.

According to an embodiment of the invention, the semiconductor chip is bonded to a metallization layer on the conducting region or to an electrically conducting sheet bonded to the metallization layer. As already mentioned, the semiconductor chip may be directly bonded to the metallization layer or indirectly via an additional electrically conducting body.

It may be possible that the power semiconductor module carries and/or comprises a circuit of more than one power semiconductor switch. For example, the power semiconductor module may comprise a half-bridge.

A half-bridge may comprise one or more first semiconductor switches (which may be connected in parallel), which are connected in series with one or more second semiconductor switches (which may be connected in parallel). The one or more first semiconductor switches may be provided by one or more first semiconductor chips. The one or more second semiconductor switches may be provided by one or more second semiconductor chips.

According to an embodiment of the invention, the power semiconductor module may comprise a half-bridge with all semiconductor chips bonded to the semiconductor wafer in the same direction. Here, and in the following, the direction of a semiconductor chip refers to its power electrodes (such as base, drain, etc.). Chips of the same direction are bonded with the same power electrode to the semiconductor wafer.

According to an embodiment of the invention, the power semiconductor module further comprises a DC+ conducting region doped into the semiconductor wafer, to which at least one first semiconductor chip is bonded, which DC+ conducting region is surrounded by a field mitigation structure doped into the semiconductor wafer, an AC conducting region doped into the semiconductor wafer, to which at least one second semiconductor chip is bonded, which DC+ conducting region is surrounded by a field mitigation structure doped into the semiconductor wafer, wherein the AC conducting region is electrically connected to a top side of the first semiconductor chip, and a DC− metallization layer electrically connected to a top side of the second semiconductor chip.

According to an embodiment of the invention, the power semiconductor module may comprise a half-bridge with the second semiconductor chips bonded to the semiconductor wafer in the reverse direction of the first semiconductor chips. The second semiconductor chips may be seen as flip chips. For example, such a configuration may result in no or only a small AC metallization layer on the semiconductor wafer.

According to an embodiment of the invention, the power semiconductor module further comprises a DC+ conducting region doped into the semiconductor wafer, to which at least one first semiconductor chip is bonded, which DC+ conducting region is surrounded by a field mitigation structure doped into the semiconductor wafer; a DC− conducting layer, to which at least one second semiconductor chip is bonded in a reverse direction with respect to the first semiconductor chip; and an AC conducting region doped into the semiconductor wafer, which AC conducting region is surrounded by a field mitigation structure doped into the semiconductor wafer and which AC conducting region is electrically connected to a top side of the at least one first semiconductor chip and to a top side of the second semiconductor chip.

It may be that an electrically conducting spacer is arranged between a second, flip chip and the corresponding metallization layer.

In all configurations, the semiconductor chip may be electrically interconnected with another semiconductor chip or a metallization layer or another electrically conducting region by an electrically conducting clip, which is attached to the top side of the semiconductor chip. The clip may have large diameters and low curvature compared to a bond wire to avoid discharges.

According to an embodiment of the invention, the power semiconductor module further comprises a housing surrounding the semiconductor wafer and the at least one semiconductor chip, the housing accommodating an encapsulation covering a front side of the semiconductor wafer and covering the at least one semiconductor chip. For example, the encapsulation may be potted into the housing.

These and other aspects of the invention will be apparent from and elucidated with reference to the embodiments described hereinafter.

BRIEF DESCRIPTION OF THE DRAWINGS

The subject matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
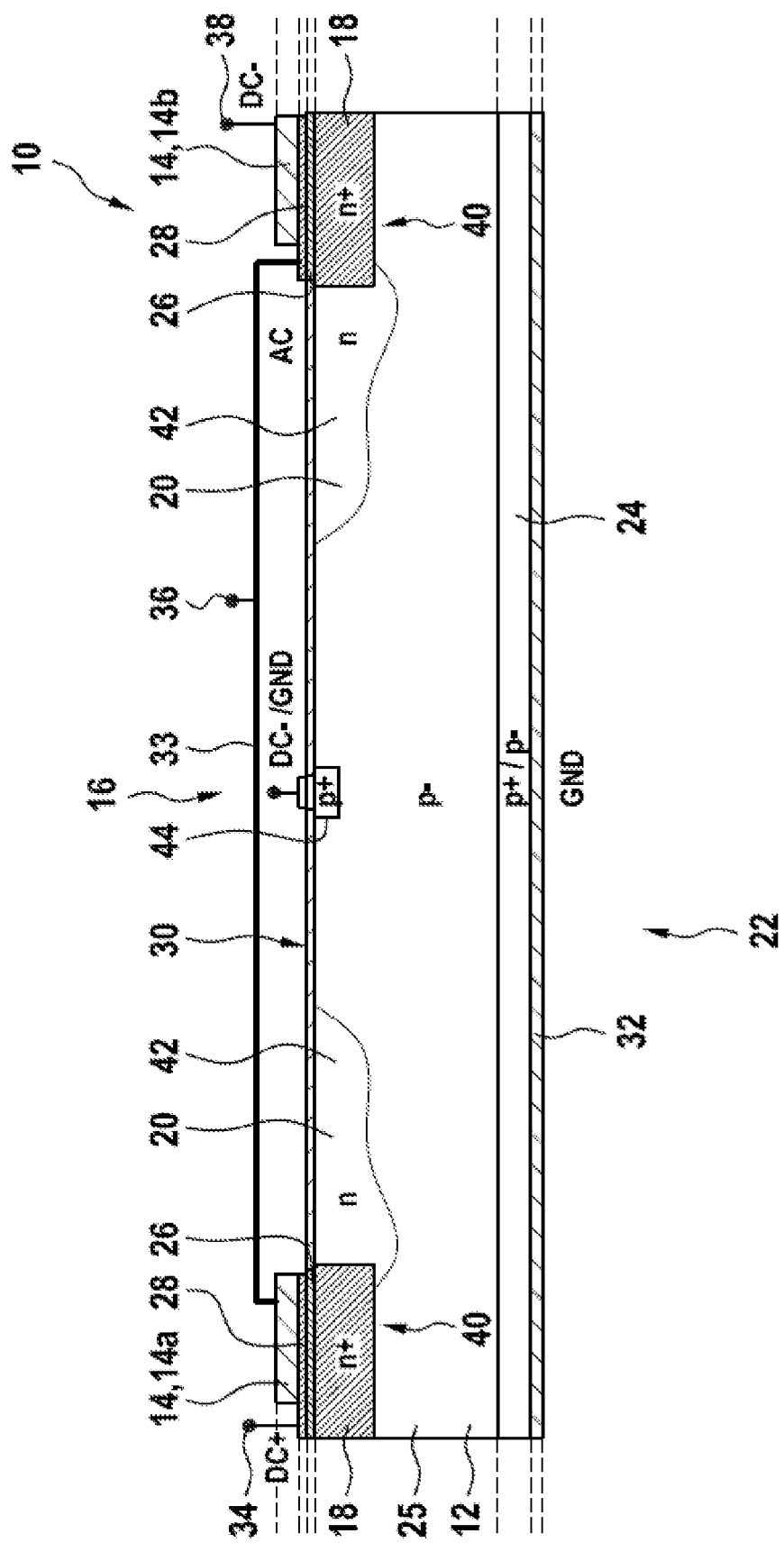
FIG. 1 schematically shows a cross-section through a power semiconductor module according to an embodiment of the invention.
Figure 2:
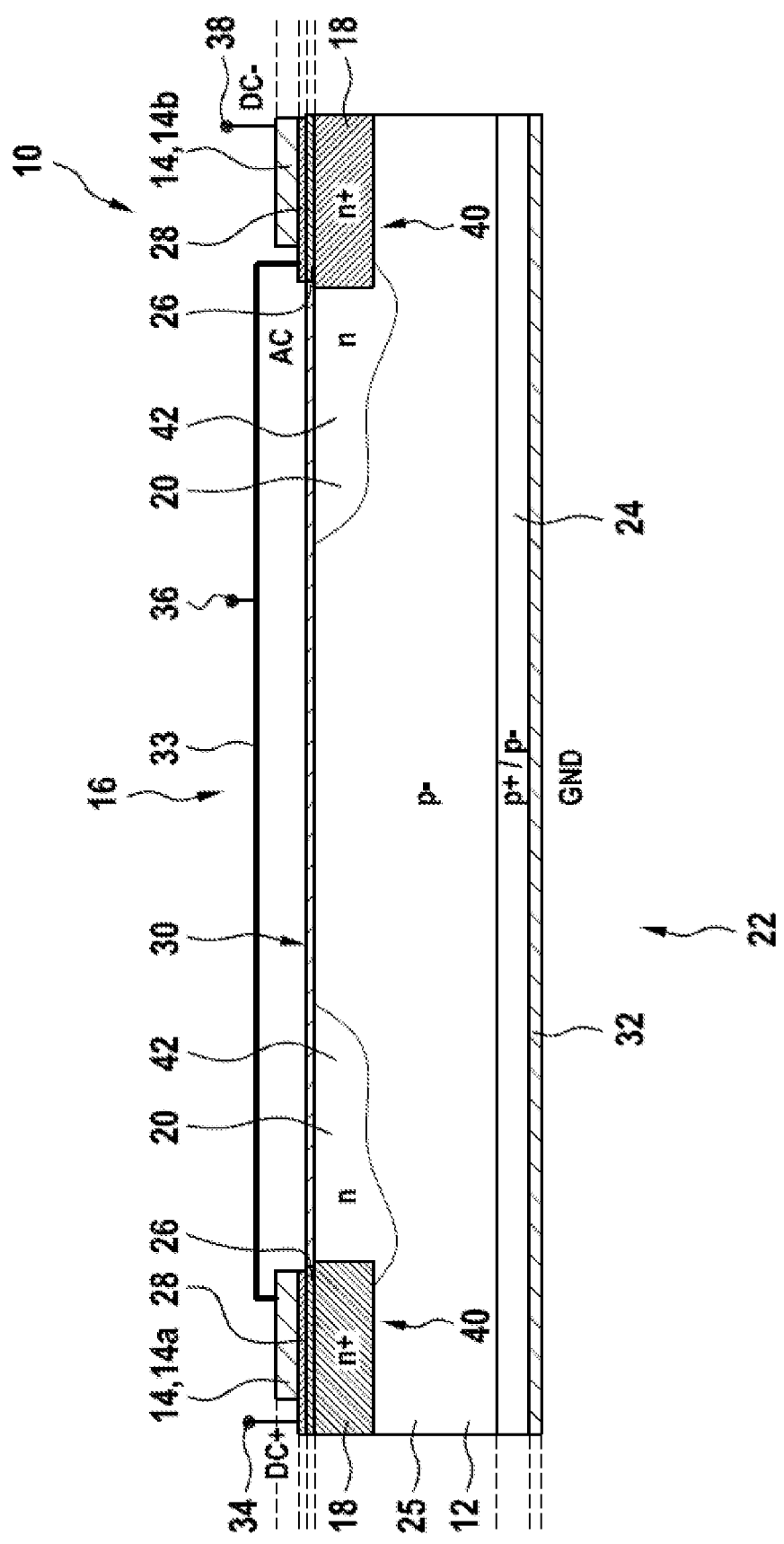
FIG. 2 schematically shows a cross-section through a power semiconductor module according to a further embodiment of the invention.

FIGS. 1 and 2 schematically show a cross-section through a power semiconductor module 10, which comprises a semiconductor wafer 12, to which power semiconductor chips 14 are bonded.

The semiconductor wafer 12 comprises a base substrate made of Si, which may have a high resistance and/or may be slightly p⁻-doped. On a front side 16, the semiconductor wafer 12 is doped to form n-doped or n⁺-doped electrically conducting regions 18 and n-doped, or n⁺-doped field mitigation structures 20 that surround the electrically conducting regions 18.

On a back side 22, the semiconductor wafer 12 may be doped to form a p-doped or p⁺-doped layer 24, which may extend about the complete surface of the back side 22.

For example, the base substrate may be a high resistivity silicon wafer 12, which is n-doped below $5 \cdot 10^{12}/cm^3$ or is p-doped below $1.7 \cdot 10^{13}/cm^3$ with a thickness between 1 and 2.5 mm. The field blocking region 25 or field blocking layer 25 is formed between the electrical conductive patterns 18, 20 and the optional back layer 24 that has also such a doping. The field blocking region 25 may extend over the complete wideness of the semiconductor wafer 12.

The electrical conductive patterns 18, 20 and/or the back layer 24 may be generated in the semiconductor wafer 12 by deep doping (implantation, diffusion, deposition and/or drive-in). For example, a very high doped n⁺-region, such as the region 18, may be obtained by phosphorus deposition from POCL3 and subsequent drive-in. The thickness of the region 18 and/or the field mitigation structure 20 may be 10 to 50 μm, which for example may be the case after 2 to 25 hours of diffusion.

For example, for achieving voltage blocking capabilities of about 20 kV, the electrically conducting region 18 and/or the field mitigation structure 20 may be generated with a drift doping (Si) of $2 \cdot 10^{12}/cm^3$ to $4 \cdot 10^{13}/cm^3$.

On every electrical conductive region 18, a metallization layer 26 is formed, which may have a thickness capable of carrying the load current of the power semiconductor module 10. Alternatively, the metallization layer 26 may be a bond layer on which an electrical conductive sheet 28 is bonded, which may mainly carry the load current. The metallization or bond layer 26 may be a standard solderable or sinterable metallization like Ti/Ni/Ag, Ti/Ni/Au or Ti/Ni/Pt or, as a thick metallization, may be based also on Cu, Ag, or Al. The electrical conducting sheet may be a metal sheet, for example made of Cu, Al, Mo or Ag, or may be made of Graphene.

The respective semiconductor chip 14 then may be either bonded to the metallization layer 26 or to the electrically conductive sheet 28.

The surface of the semiconductor wafer 12 at the front side 16 may be coated with a passivation layer 30, either completely except the area, where the metallization layers 26 are formed, or at least besides the metallization layers 26 above the electrically conductive region 18 and the field mitigation structure 20.

The passivation layer 30 may be one or more semi-insulating layers, like carbon based layers, glass, BCB (bisbenzocyclobutene), DLC (diamond like carbon), SiPOS (semi-insulating polycrystalline silicon) and/or polyimide, and/or may be used for chemical passivating the surface and/or for avoiding charging effects.

On the back side 22, the semiconductor wafer 12 may be coated with a back side bond layer 32, which may cover the complete back side surface of the semiconductor wafer 12.

The semiconductor chips 14 may be transistors and/or thyristors, i.e. actively switchable switches and may form a half-bridge. The bottom side of the first semiconductor chip 14a may be interconnected via the metallization layer 26 and/or the electrically conducting sheet 28 below the first semiconductor chip 14a with a DC+ output 34 of the power semiconductor module 10. The top side of the first semiconductor chip 14a may be electrically interconnected with a conductor 33 with the metallization layer 26 and/or the electrically conducting sheet 28 below the second semiconductor chip 14b. This conductor 33 and/or the metallization layer 26 and/or the electrically conducting sheet 28 below the second semiconductor chip 14b may be interconnected with an AC output of the power semiconductor module 10. The top side of the second semiconductor chip 14b may be interconnected with a DC− output 38 of the power semiconductor module 10.

The back layer 32 may be interconnected with a ground potential, indicated as GND and/or may be connected to a heatsink or cooler.

Due to the doping, a junction 40 is formed inside the semiconductor wafer 12, which provides mainly the blocking of high voltages. The field grading or field mitigation of the high electric fields present, when the power semiconductor module 10 is operating, is mainly provided inside the semiconductor wafer 12 at the junction 40.

When the DC+ output 34 is at positive potential compared to the AC output 36, which then is at ground potential (GND), the junction 40 below the first semiconductor chip 14a is the main blocking junction. When the AC output 36 is at positive potential compared to the DC− output 38, the junction 40 below the second semiconductor chip 14b is the main blocking junction.

In FIGS. 1 and 2, the field mitigation structure is provided by an electrically conducting region 42 with VLD (variation of lateral doping), which is in direct contact with the region 18. In general, the region 42 may be a part of the region 18 having different doping. For example, the region 18 may be n⁺-doped, while the region 42 may be n-doped. The field grading may be done in the semiconductor wafer 12 via a VLD termination.

While the region 18 extends below the corresponding semiconductor chip 14, the region 42 may be provided besides the region 18. The region 42 may not be covered by the semiconductor chip 14.

For example, the level of doping in a region 42 may fall with raising distance to the region 18. Due to the varying resistance, a maximal value of the electric field at the junction 40 may be lowered.

As shown in FIG. 1, an electrically conducting runner 44 may be provided, which is also doped into the front side 16 of the semiconductor wafer 12 between two field mitigation structures 20. For example, the runner 4 may be p-doped or $p^+$-doped. The runner 44, which also may be seen as electrically conducting region, is inside the semiconductor wafer 12 and may be electrically disconnected from the regions 18, 42. The runner 44 may be electrically connected to DC− potential or to ground potential to yield a defined potential between the field mitigation structures 20.

FIG. 2 shows a power semiconductor module 10 without such a runner 44.

Figure 3:
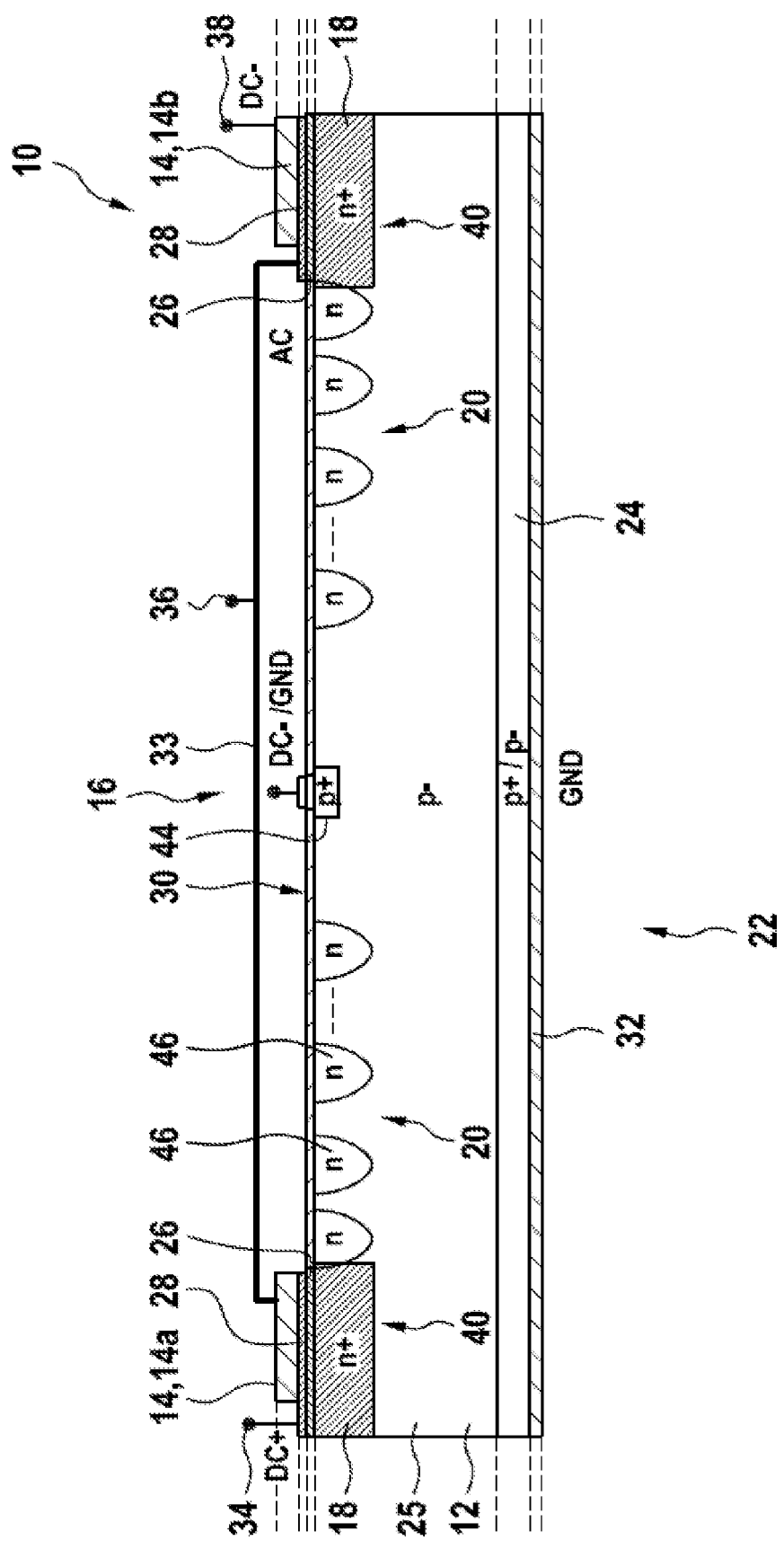
FIG. 3 schematically shows a cross-section through a power semiconductor module according to a further embodiment of the invention.
Figure 4:
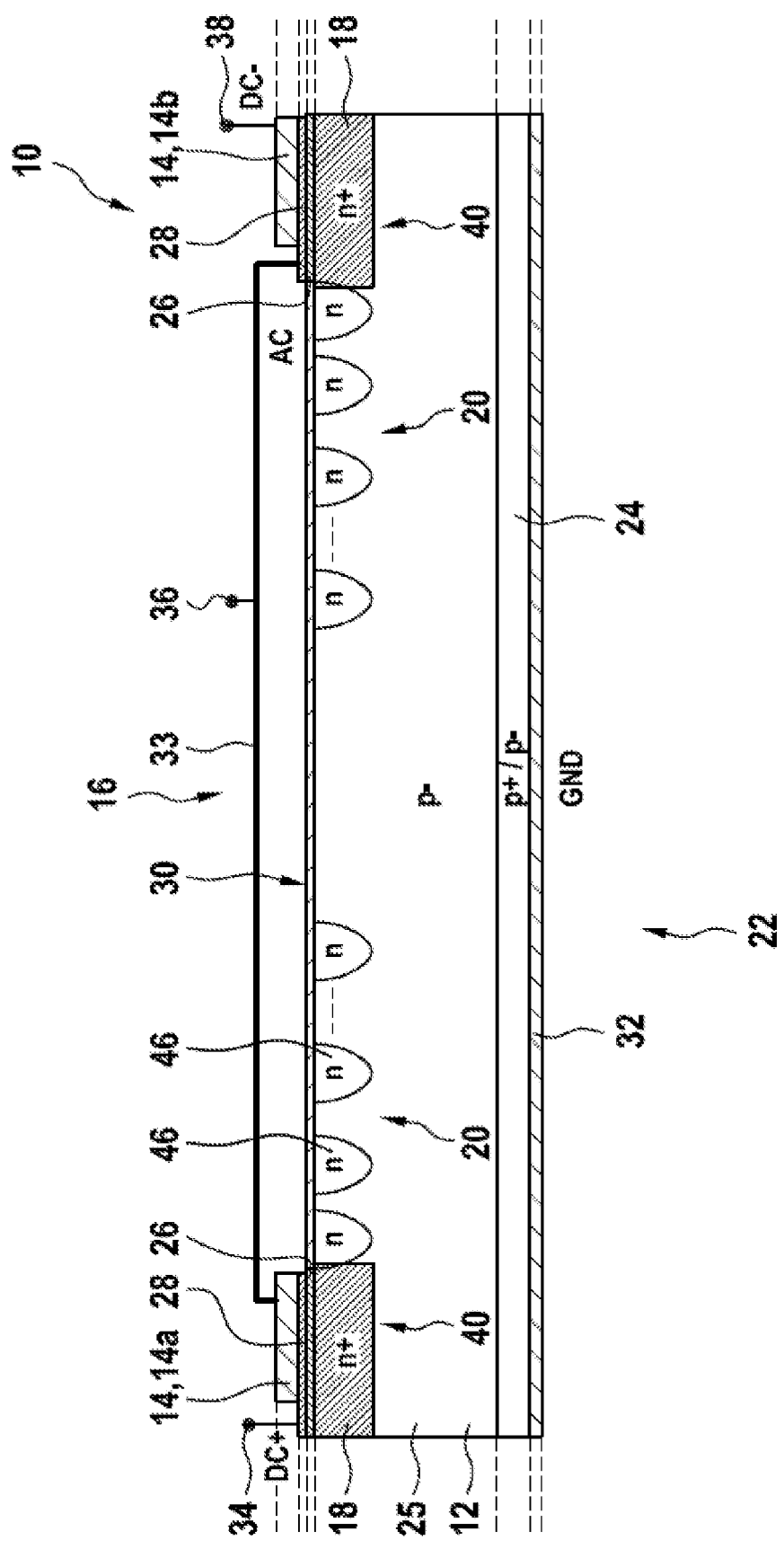
FIG. 4 schematically shows a cross-section through a power semiconductor module according to a further embodiment of the invention.

FIG. 3 and FIG. 4 show a cross-section through a power semiconductor module 10, which may be equally designed to the ones of FIGS. 1 and 2, but which have a different field mitigation structure in the form of field rings 46.

Each field ring 46 may be an electrically conducting region or channel doped inside the front surface of the semiconductor wafer 12. For example, the region 18 may be $n^+$-doped, while the field rings 46 may be n-doped.

The field rings 46 may be electrically disconnected from each other and/or from the region 18, at least inside the semiconductor wafer 12. The field rings 46 may surround the region 18 completely or partially (i.e. may be ring segments). Furthermore, the width of the field rings 46 in a lateral direction may decrease with increasing distance from the region 18.

The field rings 46 may be floating, i.e. may be disconnected from any potential of the power semiconductor module. However, the field rings also may be biased, i.e. electrically connected to a potential, such as GND, DC+ or DC−.

Figure 5A:
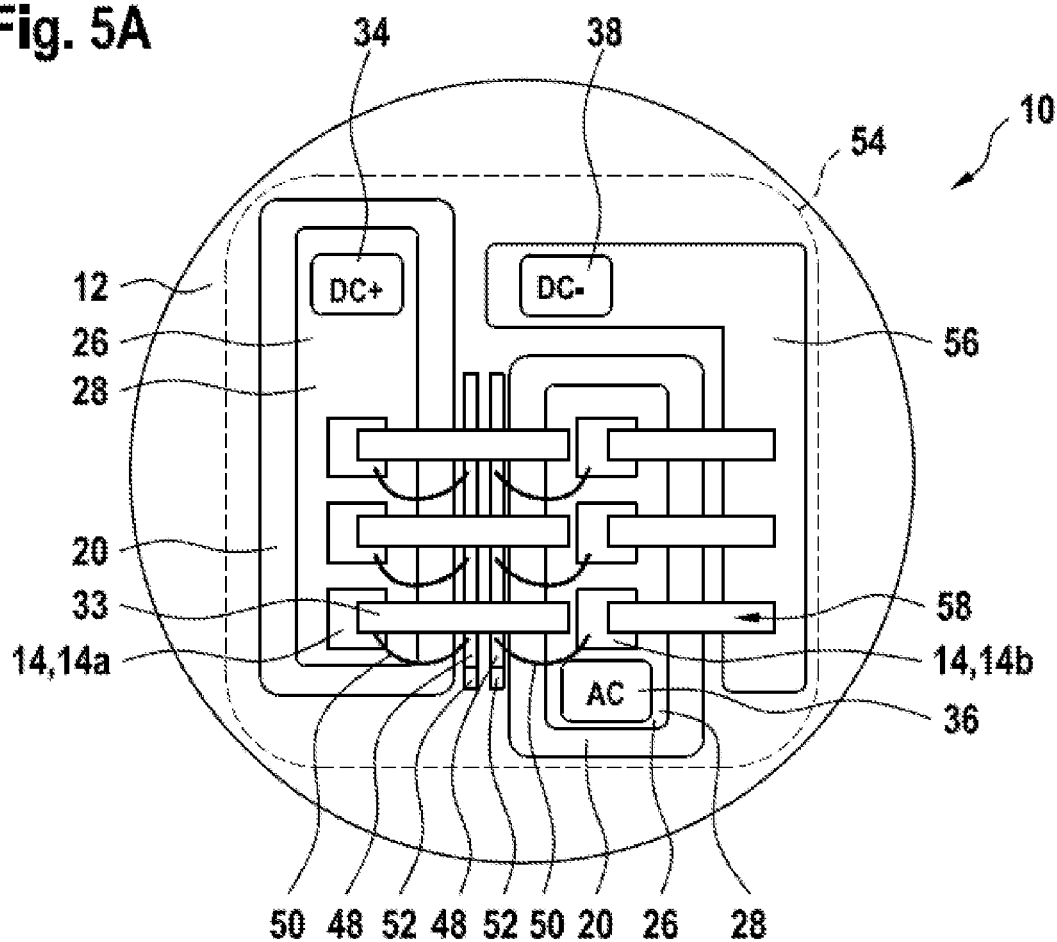
FIG. 5A schematically shows a top view on a power semiconductor module according to a further embodiment of the invention.
Figure 5B:
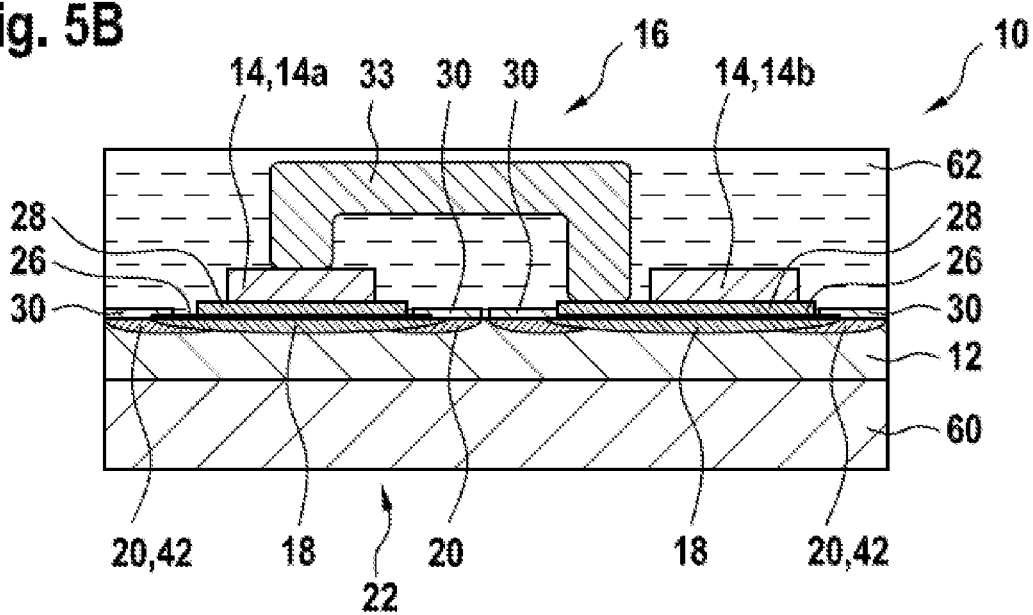
FIG. 5B schematically shows a cross-section through the power semiconductor module of FIG. 5A.

FIG. 5A shows a further embodiment of a power semiconductor module 10 in a view from above. FIG. 5B shows a cross-section through the power semiconductor module of FIG. 5A.

The power semiconductor module of FIGS. 5A and 5B may be designed like the ones in FIG. 1 to FIG. 2. The metallization layers 26 and electrically conducting regions 18 may be surrounded by a field mitigation structure 20, such as a field mitigation region 42 and/or field rings 46. In FIG. 5B, a field mitigation region 42 is shown. Here, however, also alternatively or additionally field rings 46 may be used.

On the DC+ side, a plurality of first semiconductor chips 14, 14a is bonded to the metallization layer 26 (or to a conducting sheet 28 on the metallization layer 26) below. Furthermore, on the AC side, a plurality of first semiconductor chips 14, 14a is bonded to the metallization layer 26 (or to a conducting sheet 28 on the metallization layer 26) below. Between the two rows of semiconductor chips 14 and between the corresponding field mitigation structures 20, two gate metallization layers 48 are arranged on the semiconductor wafer 12, which are connected via wire bonds 50 with the gate electrodes of the semiconductor chips 14 and with gate outputs 52 of the power semiconductor module 10.

The top side of a first semiconductor 14, 14a is connected with a clip 33 with the metallization layer 26 (or to a conducting sheet 28 on the metallization layer 26) below the second semiconductor chips 14b. As shown in FIG. 5, the clips 33 may have rounded edges with low curvature and/or a cross-section bigger than a bond wire 50.

FIG. 5A also indicates that the originally round semiconductor wafer 12 may be cut to a substantially rectangular form 54.

In FIG. 5A, a DC− metallization layer 56 is shown which, like the other metallization layers 28, may be deposited on the front surface of the semiconductor wafer 12. The metallization layer 56 need not be positioned above an electrically conducting region doped into the semiconductor wafer 12 and/or need not be surrounded by a field mitigation structure. On the metallization layer 56, analogously to the metallization layers 28, an electrically conducting sheet may be bonded. The metallization layer 56 may be interconnected with the top side of the second semiconductor chips with one or more clips 58, which may be designed analogously to the clips 33. Furthermore, the DC− output 36 may be interconnected with the metallization layer 56.

In FIG. 5B it is shown that the back side 22 of the semiconductor wafer 12 may be bonded to a metal body 60 that may act as a heat sink and as a mechanical support for the semiconductor wafer 12. For example, the metal body 60 may be made of Molybdenum and/or may be Ag sintered to the back side bond layer 32 (see FIGS. 1 to 4).

Furthermore, the components on the front side 16 of the semiconductor wafer may be cast into an encapsulation 62, such as silicone gel or epoxy. These encased components include the semiconductor chips 14, the metallization layers 26, the electrically conducting sheets 28, the clips 33 and the bond wires 50.

Figure 6A:
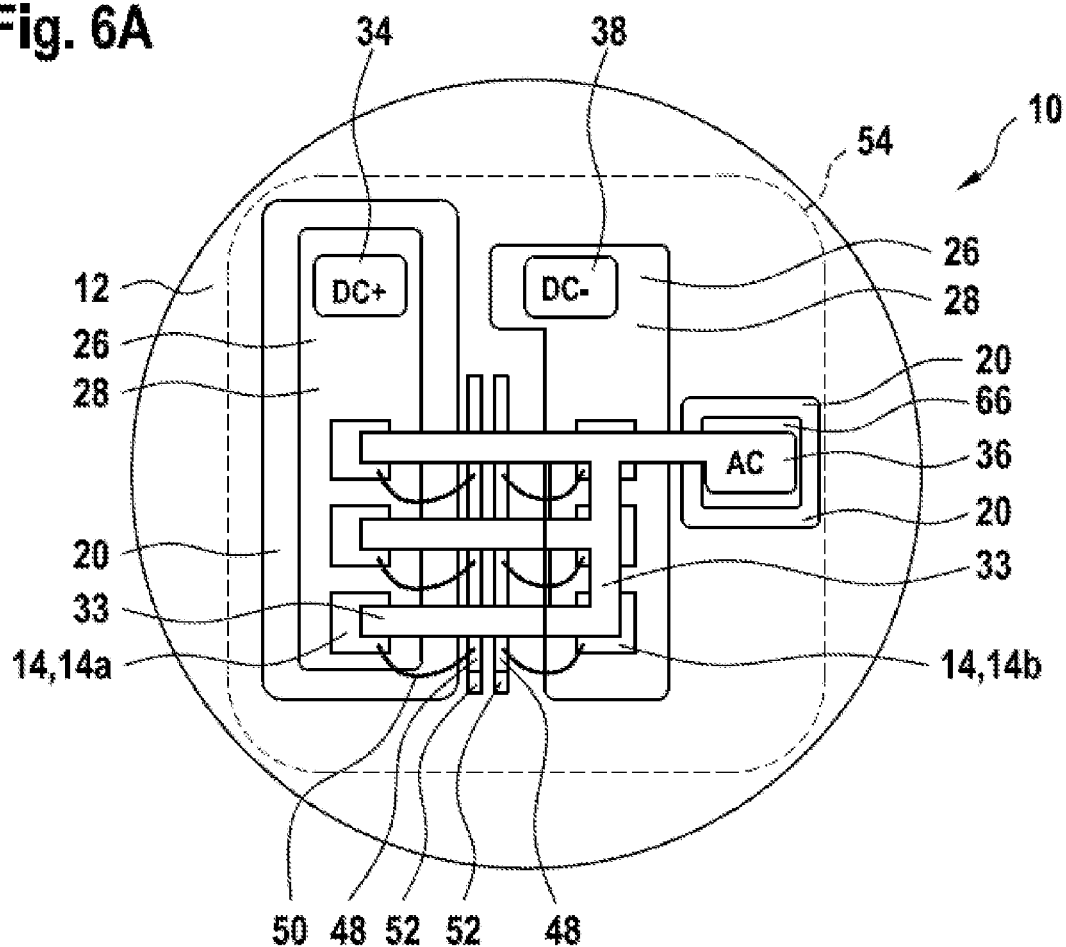
FIG. 6A schematically shows a top view on a power semiconductor module according to a further embodiment of the invention.
Figure 6B:
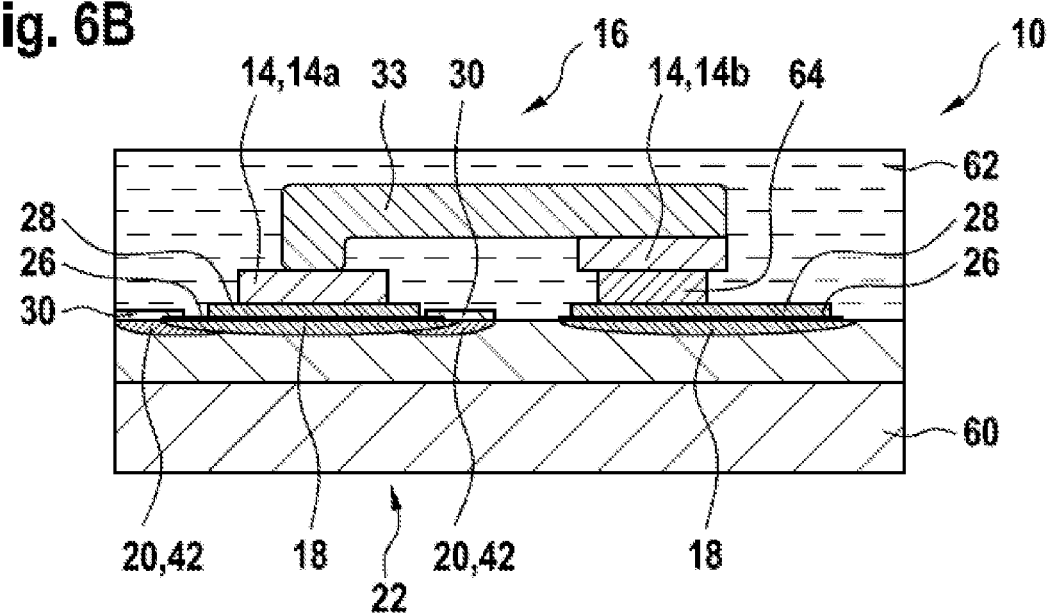
FIG. 6B schematically shows a cross-section through the power semiconductor module of FIG. 6A.

FIG. 6A shows a further embodiment of a power semiconductor module 10 in a view from above. FIG. 6B shows a cross-section through the power semiconductor module of FIG. 5A. The embodiment of FIGS. 6A and 6B may be designed analogously to the one of FIGS. 5A and 5B, but has flip chips as second semiconductor chips 14b.

In FIGS. 6A and 6B, the top side of the second semiconductor chips 14b is bonded via a metal spacer 64 to the metallization layer 26 and/or the electrically conducting sheet 28. Due to the metal spacer 64, the isolation of the semiconductor chip 14 may be better. The bottom side is bonded to the clip 33, which is also electrically interconnected with an AC-metallization layer 66, to which the AC output 36 is interconnected. The DC− output is interconnected with the metallization layer 26 below the second semiconductor chips 14b.

Due to the design of FIGS. 6A and 6B, the stray capacitance to GND of the AC metallization layer 66 may be lowered compared to FIGS. 5A and 5B.

In FIGS. 6A and 6B, the electrically conducting region 18 below the first semiconductor chips 14a and an electrically conducting region (doped in the semiconductor wafer 12 analogously to the region 18) below the metallization layer 66 are each surrounded by a field mitigation structure 20, which may be designed as described to the previous figures, for example as field mitigation region 42 and/or field rings 46.

The region 18 below the second semiconductor chips 14b is not surrounded by a field mitigation structure.

As shown in FIG. 6B, only the area of the front surface of the semiconductor wafer with a field mitigation structure 20 may be covered with a passivation layer 30.

Figure 7:
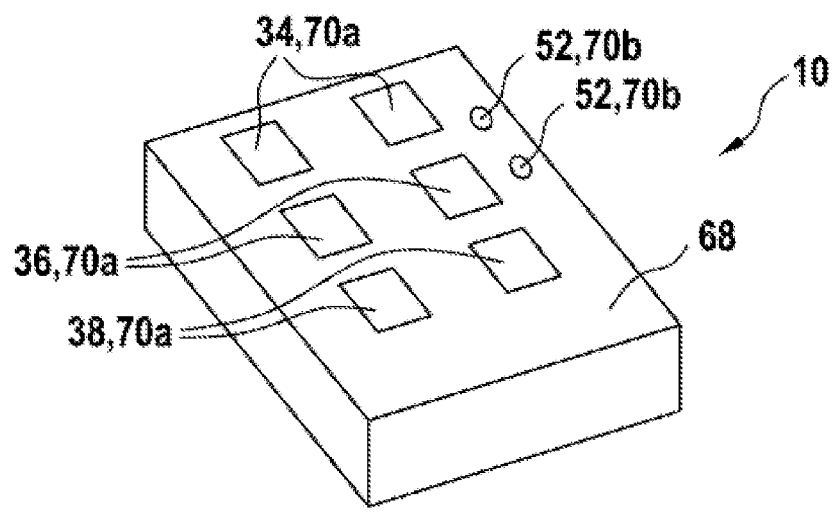
FIG. 7 schematically shows a perspective view of a housing of a power semiconductor module according to a further embodiment of the invention.

FIG. 7 shows a power semiconductor module 10 with a housing 68, in which the semiconductor wafer 12 and the components attached to it, as described with respect to the previous figures, may be enclosed. On one side, the housing 68 may have power terminals 70a for the DC+ output 34, DC− output 38 and the AC output 36 as well as auxiliary terminals 70b for the gate outputs 52. The housing 68 of FIG. 7 may be made of plastics.

Figure 8:
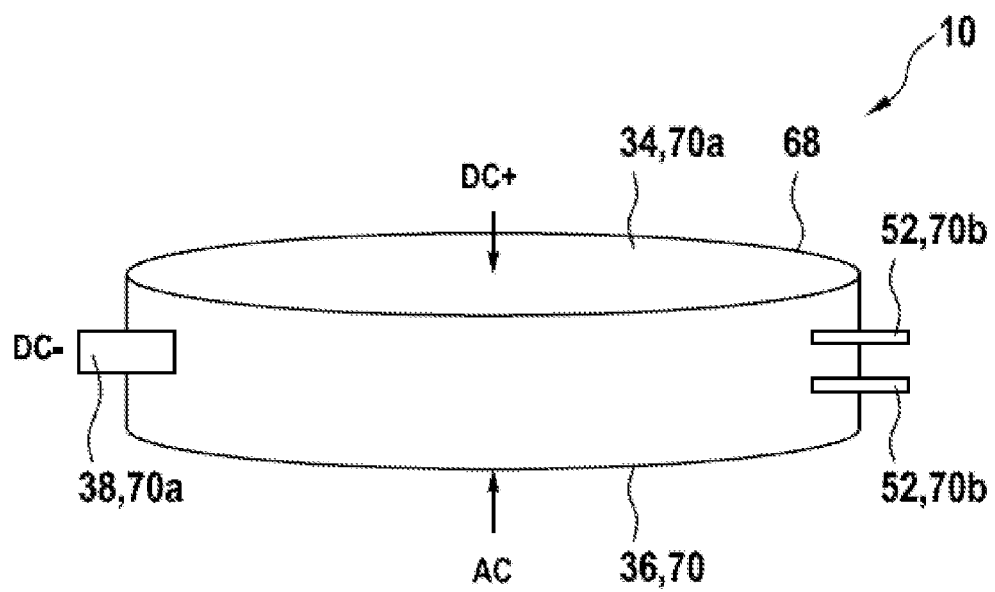
FIG. 8 schematically shows a perspective view of a housing of a power semiconductor module according to a further embodiment of the invention.
Figure 9:
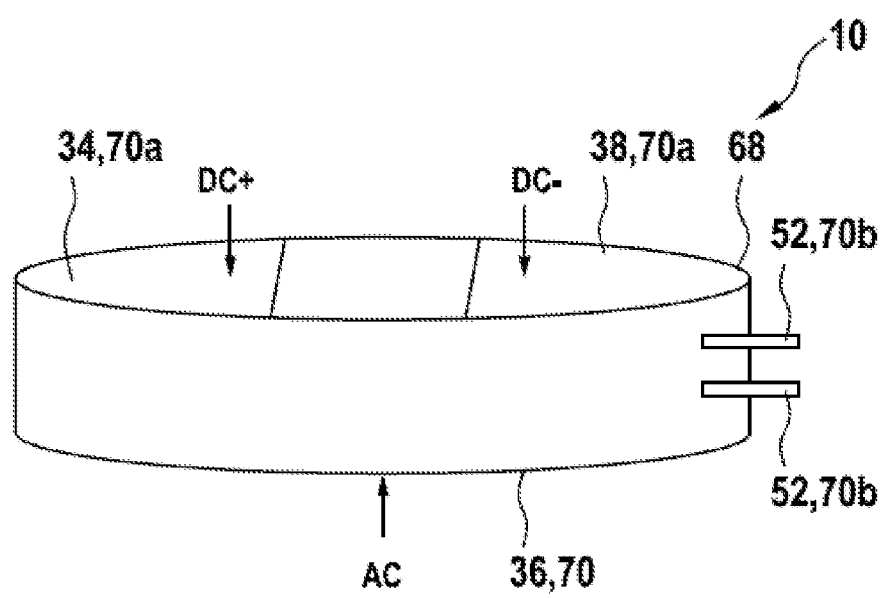
FIG. 9 schematically shows a perspective view of a housing of a power semiconductor module according to a further embodiment of the invention.

FIGS. 8 and 9 show a power semiconductor module 10 with a housing 68, in which the semiconductor wafer 12 and the components attached to it, as described with respect to the previous figures, may be enclosed. The housing 68 may be adapted for being stacked. I.e. two or more of the power semiconductor modules may be stacked onto each other, for example with interspaced cooling bodies, such that at least some of their power terminals 70a touch and are electrically interconnected.

The housing 68 of FIGS. 8 and 9 may be made of ceramics and/or may be hermetically sealed to avoid a moisture penetration to the sensitive termination areas. Furthermore, the housing 68 may have hermetically sealed ceramic feedthroughs for the terminals 70a, 70b.

In FIG. 8, two power terminals 70a are arranged on opposite sides of the housing 68, which sides are flat and adapted for touching, when the module 10 is stacked. For example, the power terminals 70a may be for DC+ and AC. A further power terminal 70a may be provided on a lateral side of the housing 68, for example for DC−.

In FIG. 9, two power terminals 70a (for example for DC+ and DC−) are arranged on the same side of the housing 68 and a third power terminal 70a (for example for AC) is arranged on the opposite side. As in FIG. 8, these sides are flat and adapted for touching, when the module 10 is stacked.

In both FIGS. 8 and 9, auxiliary terminals 70b for the gate outputs 52 may be provided in the lateral side of the housing 68.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 power semiconductor module
12 semiconductor wafer
14 semiconductor chip
16 front side
18 electrically conducting region
20 field mitigation structure
22 back side
24 back layer
25 field blocking region
26 metallization/bond layer
28 electrically conducting sheet
30 passivation layer
32 bond layer
33 conductor/clip
34 DC+ output
36 AC output
38 DC− output
40 junction
42 field mitigation region
44 electrically conducting runner
46 field ring
48 gate metallization layer
50 bond wire
52 gate output
54 rectangular form
56 metallization layer
58 clip
60 metal body
62 encapsulation
64 metal spacer
66 metallization layer
68 housing
70a power terminal
70b auxiliary terminal

The invention claimed is:

1. A power semiconductor module, comprising:
a semiconductor wafer;
a first power semiconductor chip having a bottom surface attached to a front side of the semiconductor wafer, the first power semiconductor chip comprising a power electronics switch that has a vertical current path between a top surface of the first power semiconductor chip and the bottom surface, the top surface being opposite the bottom surface;
a second power semiconductor chip attached to the front side of the semiconductor wafer and laterally spaced from the first power semiconductor chip;
wherein the semiconductor wafer comprises a field blocking region and an electrically conducting region;
wherein the electrically conducting region is formed on the field blocking region;
wherein the first power semiconductor chip is bonded to the electrically conducting region; and
wherein the field blocking region extends across the semiconductor wafer beneath both the first power semiconductor chip and the second power semiconductor chip, the electrically conducting region being separated from a back side of the semiconductor wafer by the field blocking region, the back side being opposite the front side.

2. The power semiconductor module of claim 1, wherein the semiconductor wafer is doped, such that the electrically conducting region is surrounded by a field mitigation structure adapted for lowering a maximal electrical field strength in the semiconductor wafer.

3. The power semiconductor module of claim 2, wherein the field mitigation structure comprises an electrically conducting field mitigation region with a doping that varies dependent on a distance to the electrically conducting region.

4. The power semiconductor module of claim 3, wherein the field mitigation region is in electrical contact with the electrically conducting region.

5. The power semiconductor module of claim 2, wherein the field mitigation structure comprises a number of electrically conducting field rings electrically isolated from the electrically conducting region.

6. The power semiconductor module of claim 5, wherein the field rings are electrically floating.

7. The power semiconductor module of claim 1, further comprising a passivation layer on the front side of the semiconductor wafer above the electrically conducting region.

8. The power semiconductor module of claim 1, wherein a field mitigation region adjacent the electrically conducting region is lesser n-doped than the electrically conducting region, and/or field rings concentric with the electrically conducting region are lesser n-doped than the electrically conducting region.

9. The power semiconductor module of claim 1, wherein the semiconductor wafer further comprises a second electrically conducting region, wherein the second power semiconductor chip overlies the second electrically conducting region.

10. The power semiconductor module of claim 1, wherein the field blocking region is p-doped and wherein the semiconductor wafer comprises a back layer higher p-doped than a central portion of the field blocking region.

11. The power semiconductor module of claim 1, wherein the field blocking region of the semiconductor wafer has a thickness of more than 1 mm; and
wherein the electrically conducting region has a thickness between 10 to 50 μm.

12. The power semiconductor module of claim 1, further comprising a metallization layer on the electrically conducting region, the first power semiconductor chip being electrically connected to the metallization layer.

13. The power semiconductor module of claim 12, wherein an electrically conducting sheet is bonded to the metallization layer.

14. The power semiconductor module of claim 12, wherein the first power semiconductor chip is bonded to the metallization layer on the electrically conducting region or to an electrically conducting sheet bonded to the metallization layer.

15. The power semiconductor module of claim 1, wherein the semiconductor wafer is made from Si or from SiC.

16. The power semiconductor module of claim 1, further comprising:
a metal body, the back side of the semiconductor wafer being bonded to the metal body; and
a housing surrounding the semiconductor wafer and the first and second power semiconductor chips, the housing accommodating an encapsulation at least partially covering the front side of the semiconductor wafer and at least partially covering the first and second power semiconductor chips.

17. The power semiconductor module of claim 1, wherein the electrically conducting region is n-doped and the field blocking region extends across an entire width of the semiconductor wafer.

18. The power semiconductor module of claim 1, wherein the first power semiconductor chip provides a wide bandgap electronics component.

19. The power semiconductor module of claim 5, wherein the field rings are connected at least partially to an electric potential provided by the power semiconductor module.

20. The power semiconductor module of claim 9, further comprising an electrically conducting runner extending between the electrically conductive region and the second electrically conductive region, the electrically conducting runner being connected to an electric potential.

21. The power semiconductor module of claim 13, wherein the electrically conducting sheet is made of Cu, Al, Mo, Ag or Graphene.

22. A power semiconductor module, comprising:
a semiconductor wafer;
a first power semiconductor chip having a bottom side attached to a front side of the semiconductor wafer, the first power semiconductor chip comprising a power electronics switch that has a current path between a top side of the first power semiconductor chip and the bottom side, the top side being opposite the bottom side;
a second power semiconductor chip attached to the front side of the semiconductor wafer and laterally spaced from the first power semiconductor chip;
a DC+ conducting region doped into the semiconductor wafer, wherein the first power semiconductor chip is bonded to the DC+ conducting region;
a first field mitigation structure doped into the semiconductor wafer, the DC+ conducting region being surrounded by the first field mitigation structure;
an AC conducting region doped into the semiconductor wafer, wherein the second power semiconductor chip is bonded to the AC conducting region and wherein the AC conducting region is electrically connected to the top side of the first power semiconductor chip;
a second field mitigation structure doped into the semiconductor wafer, the AC conducting region being surrounded by the second field mitigation structure; and
a DC− metallization layer electrically connected to a top side of the second power semiconductor chip.

23. A power semiconductor module, comprising:
a semiconductor wafer;
a first power semiconductor chip attached to a front side of the semiconductor wafer, the first power semiconductor chip comprising a power electronics switch;
a second power semiconductor chip attached to the front side of the semiconductor wafer and laterally spaced from the first power semiconductor chip;
a DC+ conducting region doped into the semiconductor wafer, wherein the first power semiconductor chip is bonded to the DC+ conducting region;
a first field mitigation structure doped into the semiconductor wafer, the DC+ conducting region being surrounded by the first field mitigation structure;
a DC− conducting region, wherein the second power semiconductor chip is bonded to the DC− conducting region in a reverse direction with respect to a connection of the first power semiconductor chip to the DC+ conducting region;
an AC conducting region doped into the semiconductor wafer electrically connected to a top side of the first power semiconductor chip and to a top side of the second power semiconductor chip; and
a second field mitigation structure doped into the semiconductor wafer, the AC conducting region being surrounded by the second field mitigation structure.

* * * * *